(12) United States Patent
Sakai et al.

(10) Patent No.: US 9,417,269 B2
(45) Date of Patent: Aug. 16, 2016

(54) CURRENT SENSOR

(75) Inventors: Ryosuke Sakai, Kariya (JP); Takamasa Kinpara, Kariya (JP); Norihiro Kurumado, Nagoya (JP); Kousuke Nomura, Nagoya (JP)

(73) Assignee: DENSO CORPORATION, Kariya (JP)

( * ) Notice: Subject to any disclaimer, the term of this patent is extended or adjusted under 35 U.S.C. 154(b) by 72 days.

(21) Appl. No.: 14/123,820

(22) PCT Filed: Jun. 26, 2012

(86) PCT No.: PCT/JP2012/004119
§ 371 (c)(1),
(2), (4) Date: Dec. 4, 2013

(87) PCT Pub. No.: WO2013/001789
PCT Pub. Date: Jan. 3, 2013

(65) Prior Publication Data
US 2014/0111196 A1   Apr. 24, 2014

(30) Foreign Application Priority Data
Jun. 28, 2011   (JP) .................................. 2011-143167

(51) Int. Cl.
G01R 33/02 (2006.01)
G01R 19/00 (2006.01)
G01R 33/09 (2006.01)
G01R 15/20 (2006.01)

(52) U.S. Cl.
CPC .......... *G01R 19/0092* (2013.01); *G01R 15/205* (2013.01); *G01R 33/093* (2013.01)

(58) Field of Classification Search
CPC .............................. G01R 33/093; G01R 33/09
USPC ................................ 324/252, 207.21, 117 R
See application file for complete search history.

(56) References Cited

U.S. PATENT DOCUMENTS 5,561,366 A  10/1996  Takahashi et al.
2008/0030190 A1  2/2008  Ishihara et al.

FOREIGN PATENT DOCUMENTS

JP   H7-92199 A   4/1995
(Continued)

OTHER PUBLICATIONS

International Search Report of the International Searching Authority mailed Jul. 31, 2012 for the corresponding international application No. PCT/JP2012/004119 (with English translation).
(Continued)

*Primary Examiner* — Reena Aurora
(74) *Attorney, Agent, or Firm* — Posz Law Group, PLC

(57) ABSTRACT

A current sensor for measuring a current flowing through a conductor includes a sensor substrate, a magnetoelectric converter formed on a surface of the sensor substrate and configured to output a signal changing with an applied magnetic field, and a magnetic shield that surrounds the sensor substrate and the conductor to magnetically shield the inside from the outside. The output signal of the magnetoelectric converter changes with a magnetic filed applied along the formation surface of the sensor substrate. The magnetic shield has at least one gap for reducing magnetic saturation in the magnetic shield. The gap and the sensor substrate are located at the same height in a z-direction orthogonal to the formation surface of the sensor substrate.

8 Claims, 3 Drawing Sheets

(56) References Cited

FOREIGN PATENT DOCUMENTS

| | | | |
|---|---|---|---|
| JP | 07-092199 | * | 7/1995 |
| JP | 2008-275321 A | | 11/2008 |
| JP | 2010-2277 A | | 1/2010 |
| JP | 2010-8050 A | | 1/2010 |
| JP | 2010-14477 A | | 1/2010 |

OTHER PUBLICATIONS

Japanese Office Action mailed Sep. 17, 2013 for the corresponding Japanese application No. 2011-143167(with English translation).
Chinese Office Action mailed on Dec. 22, 2015 in the corresponding CN application No. 201280032080.8(English translation attached).
Office Action dated May 26, 2015 in the corresponding CN application No. 2012 8003 2080.8 ( English translation attached ).

* cited by examiner z DIRECTION x DIRECTION

US 9,417,269 B2

CURRENT SENSOR

CROSS REFERENCE TO RELATED APPLICATION

This application is a U.S. national stage application of PCT/JP2012/004119 filed on Jun. 26, 2012, and is based on Japanese Patent Application No. 2011-143167 filed on Jun. 28, 2011, the contents of which are incorporated herein by reference.

TECHNICAL FIELD

The present disclosure relates to a current sensor for measuring a measurement current to be measured based on a change in a resistance of a magnetoresistive effect element due to a magnetic field induced by the measurement current.

BACKGROUND ART

As disclosed in, for example, a patent document 1, a current sensor has been proposed that includes a bus bar, a magnetic detector positioned relative to the bas bar so that a magnetic field induced by a current flowing through the bus bar can be applied to a magnetic responsive surface, and a magnetic shield which magnetically shields the magnetic detector. The magnetic shield has a ring-shaped surrounding portion to surround the bus bar and the magnetic detector inside, and the ring-shaped surrounding portion has a gap, at least, at one position. When a height direction is defined as a direction of a line passing the bus bar and the magnetic detector on an imaginary plane which is perpendicular to a length direction of the bus bar and contains a position where the magnetic detector exists, the gap and the bus bar are located at the same or almost the same position in the height direction.

The bus bar has a plate shape having a thickness direction along the height direction. A magnetic responsive direction of the magnetic responsive surface is the same as a width direction of the bus bar. Therefore, the magnetic detector does not respond to a magnetic field in the height direction.

As described above, in the current sensor disclosed in the patent document 1, the gap and the bus bar are located at the same or almost the same position in the height direction. A magnetic flux flowing in the magnetic shield is discharged through the gap and generates a magnetic field outside. The magnetic field generated by the gap (hereinafter referred to as a gap magnetic field) varies depending on a shape of the magnetic shield. In the case of a structure shown in FIG. 1, since the shape of the magnetic shield is symmetrical with respect to a line connecting two gaps (hereinafter referred to as a reference line), the gap magnetic field is orthogonal to the reference line. In the patent document 1, although the gap and the bus bar are located at the same or almost the same position in the height direction, the gap and the magnetic detector are not located at the same position in the height direction. Therefore, the gap magnetic field is applied obliquely to the magnetic detector, and the gap magnetic field along the width direction of the bus bar is applied to the magnetic responsive surface. As a result, a resistance of a magnetoresistive effect element may change, so that accuracy of detecting current may be reduced.

PRIOR ART

Patent Document

Patent Document 1: JP-A-2010-2277

SUMMARY OF THE INVENTION

In view of the above, it is an object of the present disclosure to provide a current sensor for reducing a reduction in accuracy of detecting current.

According to an aspect of the present disclosure, a current sensor for measuring current flowing through a conductor includes a sensor substrate, a magnetoelectric converter, and a magnetic shield. The magnetoelectric converter is formed on a surface of the sensor substrate, and an output signal of the magnetoelectric converter changes with an applied magnetic field. The magnetic shield surrounds the sensor substrate and the conductor to magnetically shield the inside from the outside. The current is measured based on a change in the output signal caused by a magnetic field induced by the current. The output signal of the magnetoelectric converter changes with a magnetic field applied along the formation surface of the sensor substrate. The magnetic shield has at least one gap for reducing magnetic saturation in the magnetic shield. The gap and the sensor substrate are located at the same height in a z-direction orthogonal to the formation surface of the sensor substrate.

A magnetic flux flowing in the magnetic shield is discharged through the gap and generates a magnetic field outside. The magnetic field generated by the gap (hereinafter referred to as a gap magnetic field) varies depending on a shape of the magnetic shield. According to the present aspect, the gap and the sensor substrate are located at the same height in the z-direction orthogonal to the formation surface of the sensor substrate. Therefore, the gap magnetic field is applied perpendicularly to the magnetoelectric converter. Thus, the change in the output signal of the magnetoelectric converter caused by the gap magnetic field is reduced, so that a reduction in accuracy of detecting the current can be reduced.

BRIEF DESCRIPTION OF THE DRAWINGS

The above and other objects, features and advantages of the present disclosure will become more apparent from the following detailed description made with reference to the accompanying drawings. In the drawings.

EMBODIMENTS OF THE INVENTION

An embodiment of the present disclosure is described with reference to the drawings.

Figure 1:
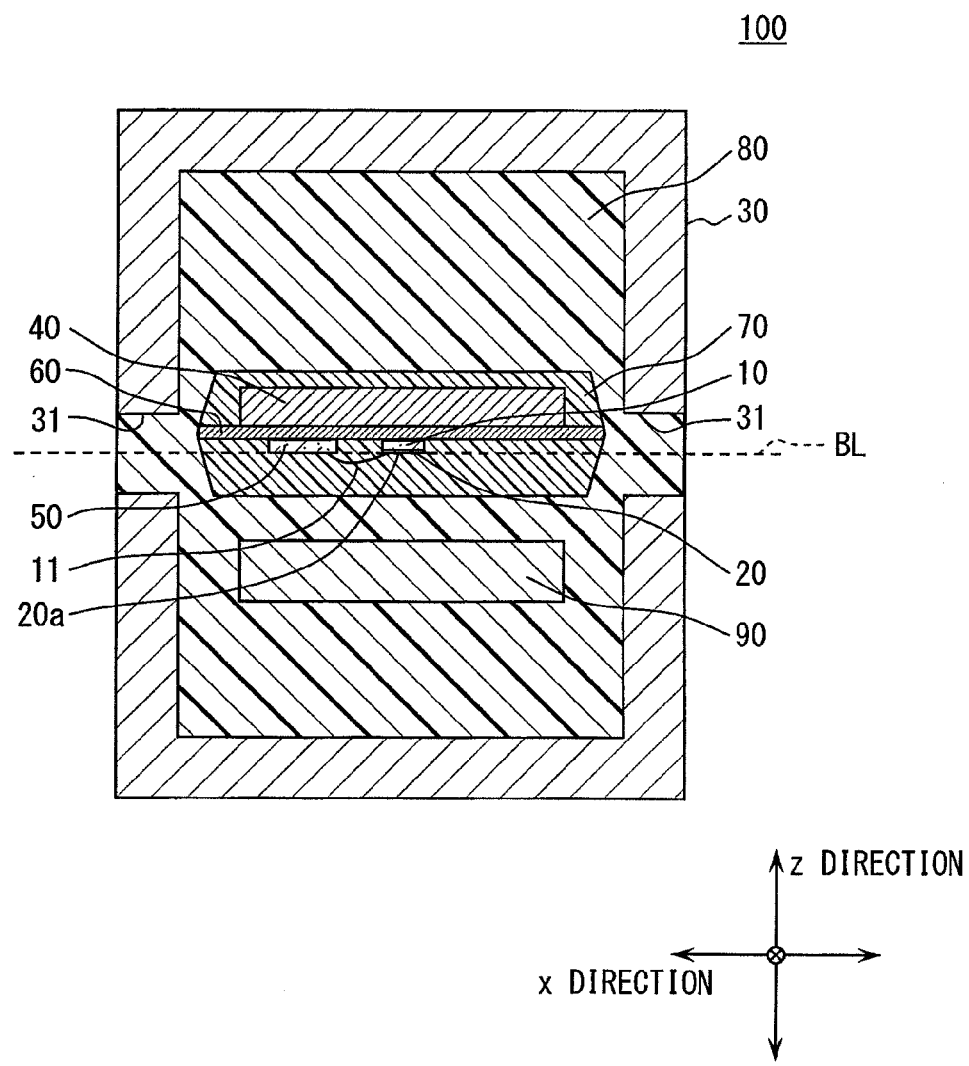
FIG. 1 is a diagram illustrating a cross-sectional view of a current sensor according to an embodiment of the present disclosure.
Figure 2:
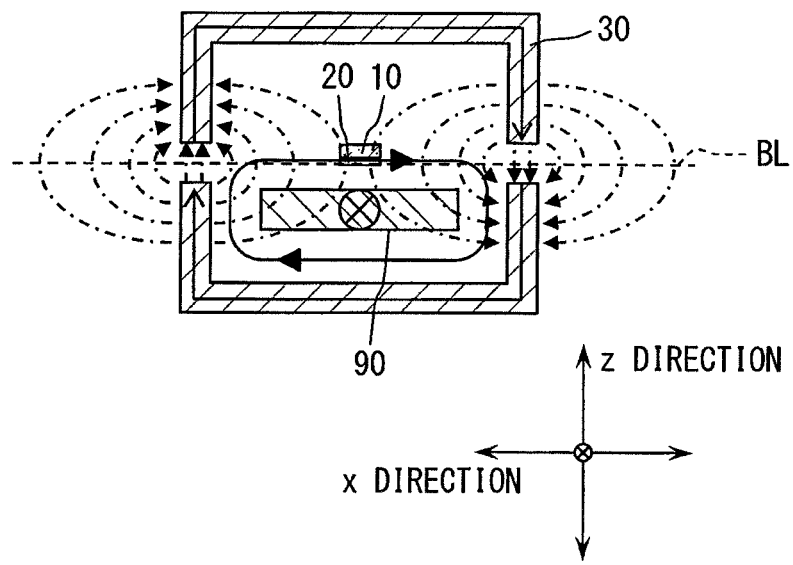
FIG. 2 is a diagram illustrating a cross-sectional view for explaining a gap magnetic field.
Figure 3:
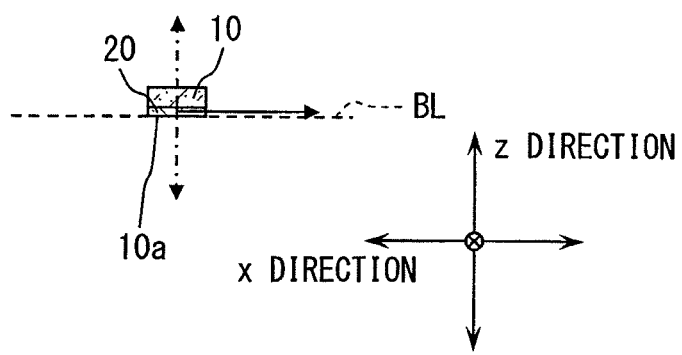
FIG. 3 is a diagram illustrating a cross-sectional view for explaining a magnetic field applied to a magnetoresistive effect element.
Figure 4:
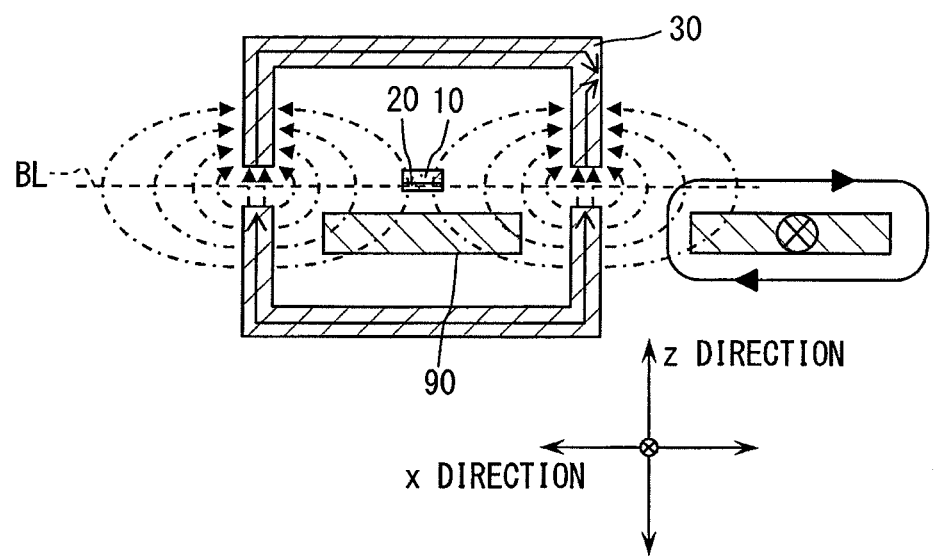
FIG. 4 is a diagram illustrating a cross-section view for explaining a gap magnetic field due to an external magnetic field.
Figure 5:
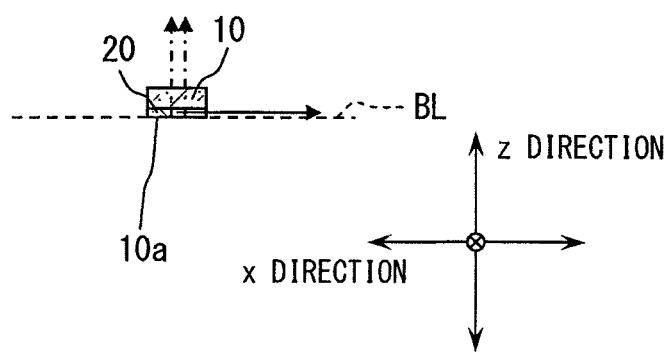
FIG. 5 is a diagram illustrating a cross-sectional view for explaining a magnetic field applied to a magnetoresistive effect element.

FIG. 1 is a diagram illustrating a cross-sectional view of a current sensor according to the embodiment. FIG. 2 is a diagram illustrating a cross-sectional view for explaining a gap magnetic field. FIG. 3 is a diagram illustrating a cross-sectional view for explaining a magnetic field applied to a magnetoresistive effect element. FIG. 4 is a diagram illustrating a cross-section view for explaining a gap magnetic field due to an external magnetic field. FIG. 5 is a diagram illustrating a cross-sectional view for explaining a magnetic field applied to a magnetoresistive effect element. In FIGS. 2 and 4, a current sensor 100 is illustrated in a simplified manner to clarify the gap magnetic field. Hereinafter, a direction along a formation surface 10a, which is described later, is referred to as a x-direction, a direction along the formation surface 10a and orthogonal to the x-direction is referred to as a y-direction, and a direction orthogonal to the formation surface 10a is referred to as a z-direction.

As shown in FIG. 1, the current sensor 100 is a coreless current sensor. The current sensor 100 mainly includes a sensor substrate 10, a magnetoresistive effect element 20, and a magnetic shield 30. The magnetoresistive effect element 20 is formed on the sensor substrate 10. The magnetic shield 30 surrounds the sensor substrate 10 and a measurement conductor 90 where a measurement current to be measured flows. The current sensor 100 measures the measurement current based on a change in a resistance of the magnetoresistive effect element 20 caused by a magnetic field (hereinafter referred to as a measurement magnetic field) induced by the measurement current. According to the embodiment, the current sensor 100 further includes a bias magnet 40, a circuit substrate 50, a supporting substrate 60, a molding resin 70, and a spacer 80 in addition to the components 10-30.

The sensor substrate 10 is a semiconductor substrate, and the magnetoresistive effect element 20 is formed on a surface 10a of the sensor substrate 10 (the surface 10a is hereinafter referred to as a formation surface 10a). As shown in FIG. 1, the sensor substrate 10 is mounted on the supporting substrate 60 at a back surface of the formation surface 10a. The sensor substrate 10 is electrically connected to the circuit substrate 50 through a wire 11, and an electrical signal containing the change in the resistance of the magnetoresistive effect element 20 is outputted to the circuit substrate 50 through the wire 11.

The resistance of the magnetoresistive effect element 20 changes only with a magnetic field applied along the formation surface 10a. Although not shown in the drawings, the magnetoresistive effect element 20 has a multilayer structure including a free layer, an interlayer, a pin layer, and a magnetic layer that are layered on top of each other in this order. A magnetization direction of the free layer changes with a magnetic field applied along the formation surface 10a. The interlayer is non-magnetic. A magnetization direction of the pin layer is fixed. The magnetic layer fixes the magnetization direction of the pin layer. According to the embodiment, the interlayer has insulation properties, and the magnetoresistive effect element 20 is a tunnel magnetoresistive effect element. When a voltage is applied between the free layer and the fixed layer, current (tunnel current) flows through the interlayer between the free layer and the fixed layer. An ease of flow of the tunnel current depends on the magnetization directions of the free layer and the fixed layer. The ease of flow is maximized when the magnetization directions of the free layer and the fixed layer are parallel to each other and minimized when the magnetization directions of the free layer and the fixed layer are antiparallel to each other. Accordingly, the change in the resistance of the magnetoresistive effect element 20 is minimized when the magnetization directions of the free layer and the fixed layer are parallel to each other and maximized when the magnetization directions of the free layer and the fixed layer are antiparallel to each other.

According to the embodiment, a half-bridge circuit is constructed with two magnetoresistive effect elements 20, and a full-bridge circuit is constructed with two half-bridge circuits. The magnetization directions of the free layers of the two magnetoresistive effect elements 20, which construct the half-bridge circuit, are antiparallel to each other so that the resistances of the two magnetoresistive effect elements 20 can change in opposite directions. That is, as the resistance of one of the two magnetoresistive effect elements 20 decreases, the resistance of the other of the two magnetoresistive effect elements 20 increases. A difference in midpoint potential between the two half-bridge circuits, which construct the full-bridge circuit, is outputted to the circuit substrate 50 through the wire 11.

The magnetic shield 30 has a tube shape and is made of a material having a high permeability. The magnetic shield 30 accommodates the components 10, 20, 40-80, and the measurement conductor 90 inside and magnetically shields the inside from the outside. As indicated by a solid line in FIG. 2, the measurement magnetic field generated by the measurement conductor 90 propagates through the magnetic shield 30, is concentrated in the magnetic shield 30, and then circulates through the magnetic shield 30 in one direction. As indicated by a solid line in FIG. 4, the external magnetic field concentrated on the magnetic shield 30 propagates in both directions.

The magnetic shield 30 has a gap 31 for reducing magnetic saturation in the magnetic shield 30. A magnetic flux flowing in the magnetic shield 30 is discharged through the gap 31. As indicated by a chain line in FIGS. 2 and 4, the magnetic flux discharged through the gap 31 generates a magnetic field (hereinafter referred to as a gap magnetic field) outside. According to the embodiment, the magnetic shield 30 has two gaps 31 so that two gap magnetic fields can be applied to the magnetoresistive effect element 20.

The bias magnet 40 is a permanent magnet and applies a bias magnetic field to the free layer. Because of the bias magnetic field, an initial value (zero point) of the magnetization direction of the free layer is set. The bias magnet 40 faces the sensor substrate 10 across the supporting substrate 60.

The circuit substrate 50 includes a semiconductor substrate where a circuit for processing an output signal of the magnetoresistive effect element 20 is formed. The circuit substrate 50 calculates a value of the measurement current based on an output signal of the full-bridge circuit constructed with the magnetoresistive effect element 20. The circuit substrate 50 is mounted on the supporting substrate 60 and arranged next to the sensor substrate 10.

The supporting substrate 60 is made from a non-magnetic material. The sensor substrate 10, the bias magnet 40, the circuit substrate 50, and the supporting substrate 60 are integrally joined and covered by the molding resin 70. The measurement conductor 90 and the molding resin 70 covering the sensor substrate 10, the bias magnet 40, the circuit substrate 50, and the supporting substrate 60 are fixed inside the magnetic shield 30 through the spacer 80. The molding resin 70 and the spacer 80 are made of a material having non-magnetic and insulation properties. As shown in FIG. 2, the measurement current flows in a y-direction.

Next, features of the current sensor 100 according to the embodiment are described. As shown in FIGS. 1 and 2, an outline of an inner wall and a cross-sectional shape of the magnetic shield 30 taken along a x-z plane defined by the x-direction and the z-direction passing the formation surface 10a (the magnetoresistive effect element 20) is symmetrical with respect to a reference line BL (broken line in the drawings) which extends along the x-direction and passes the formation surface 10a. The gap 31 is formed in a symmetrical portion of the magnetic shield 30 and located at the same height as the sensor substrate 10 in the height direction.

According to the embodiment, each of the gaps 31 is located at the same height as the sensor substrate 10, and the center of the gap 31 is located at the same height as the formation surface 10a. Further, the sensor substrate 10 is located in the center of the symmetrical portion of the magnetic shield 30, and two gaps 31 face each other across the sensor substrate 10.

Next, advantages of the current sensor 100 are described. As described above, the measurement magnetic field propagates through the magnetic shield 30, is concentrated in the magnetic shield 30, and then circulates through the magnetic shield 30 in one direction. Then, the magnetic flux flowing in the magnetic shield 30 is discharged through the gap 31 and generates the gap magnetic field outside. The gap magnetic field varies depending on the shape of the magnetic shield 30. According to the present disclosure, the gap 31 is formed in the symmetrical portion of the magnetic shield 30 with respect to the reference line BL. Thus, the gap magnetic field in a region surrounded by the symmetrical portion is symmetrical with respect to the reference line BL, and a direction of the gap magnetic field at the reference line BL is orthogonal to the reference line BL.

According to the embodiment, the gap 31 and the sensor substrate 10 are located at the same height in the z-direction. Thus, as shown in FIGS. 3 and 5, the gap magnetic field is applied perpendicularly to the magnetoresistive effect element 20. As described above, the resistance of the magnetoresistive effect element 20 changes with a magnetic field applied along the formation surface 10a. Therefore, the resistance of the magnetoresistive effect element 20 is less likely to change with the gap magnetic field. Since the change in the resistance of the magnetoresistive effect element 20 caused by the gap magnetic field is reduced, a reduction in accuracy of detecting current can be reduced.

Assuming that some of the gaps are located at the same height as the sensor substrate, the gap magnetic field is also generated through another gap that is located at a different height from the sensor substrate. It is not always true that the direction of this gap magnetic field at the reference line BL is orthogonal to the reference line BL. Therefore, the direction of the gap magnetic field applied to the magnetoresistive effect element 20 may be along the formation surface 10a. If such a gap magnetic field is applied, the resistance of the magnetoresistive effect element 20 may change due to the gap magnetic field, and the accuracy of detecting current may be reduced.

According to the embodiment, each of the gaps 31 is located at the same height as the sensor substrate 10 in the z-direction. Thus, since it is less likely that the direction of the gap magnetic field applied to the magnetoresistive effect element 20 is along the formation surface 10a, the reduction in the accuracy of detecting current can be reduced.

As shown in FIG. 2, the gap magnetic field is formed in a concentric circular or ellipsoidal pattern with respect to the center of the gap 31. Regarding this, according to the embodiment, the center of the gap 31 is located at the same height as the formation surface 10a. In such an approach, as compare to when the center of the gap 31 is located at a different height from the formation surface 10a, the direction of the gap magnetic field at the reference line BL approaches the direction orthogonal to the reference line BL. Accordingly, since it is less likely that the direction of the gap magnetic field applied to the magnetoresistive effect element 20 is along the formation surface 10a, the reduction in the accuracy of detecting current can be reduced.

The sensor substrate 10 is located in the center of the symmetrical portion of the magnetic shield 30, and two gaps 31 face each other across the sensor substrate 10. As described above, the measurement magnetic field propagates through the magnetic shield 30, is concentrated in the magnetic shield 30, and then circulates through the magnetic shield 30 in one direction. Therefore, as shown in FIGS. 2 and 3, the gap magnetic field is generated in each of the gaps 31 that face each other across the sensor substrate 10. Thus, the gap magnetic fields applied to the sensor substrate 10 located in the center of the magnetic shield 30 have the same magnitude but different directions. As a result, the gap magnetic fields are canceled at the sensor substrate 10. In this way, since it is less likely that the direction of the gap magnetic field applied to the magnetoresistive effect element 20 is along the formation surface 10a, the reduction in the accuracy of detecting current can be reduced.

As shown in FIG. 4, the external magnetic field concentrated on the magnetic shield 30 propagates through the magnetic shield 30 in both directions, not in one direction. Therefore, as shown in FIG. 5, the gap magnetic fields generated, due to the external magnetic field, in the gaps 31 that face each other have the same direction. Thus, the gap magnetic fields applied to the sensor substrate 10 located in the center of the magnetic shield 30 have the same magnitude and the same direction. However, as described above, the resistance of the magnetoresistive effect element 20 changes with a magnetic field applied along the formation surface 10a. Therefore, the resistance of the magnetoresistive effect element 20 is less likely to change with the gap magnetic field due to the external magnetic field. Since the change in the resistance of the magnetoresistive effect element 20 is reduced, the reduction in accuracy of detecting current can be reduced.

The circuit substrate 50 is located inside the magnetic shield 30. Thus, as compared to when the circuit substrate 50 is located outside the magnetic shield, an increase in size of the current sensor 100 is reduced. Further, the external magnetic field applied to the circuit substrate 50 is reduced.

The sensor substrate 10, the bias magnet 40, the circuit substrate 50, and the supporting substrate 60 are integrally joined and covered by the molding resin 70. Thus, electrical connection between unintended portions through a foreign matter having electrical conductivity can be reduced. Further, the strength of mechanical connection between the sensor substrate 10, the bias magnet 40, the circuit substrate 50, and the supporting substrate 60 can improved.

The measurement conductor 90 and the molding resin 70 covering the sensor substrate 10, the bias magnet 40, the circuit substrate 50, and the supporting substrate 60 are fixed inside the magnetic shield 30 through the spacer 80. Thus, as compared to when the measurement conductor and the sensor substrate are separately fixed to the magnetic shield, a variation in a relative position between the measurement conductor 90 and the sensor substrate 10 can be reduced. Therefore, the reduction in accuracy of detecting current due to the relative position variation can be reduced.

The half-bridge circuit is constructed with two magnetoresistive effect elements 20, and the full-bridge circuit is constructed with two half-bridge circuits. The difference in midpoint potential between the two half-bridge circuits, which construct the full-bridge circuit, is outputted to the circuit substrate 50. Thus, as compared to when current is detected based on a midpoint potential in one half-bridge circuit, accuracy of detecting current can be improved.

According to the embodiment, the initial value (zero point) of the magnetization direction of the free layer is set by applying the bias magnetic field, which is emitted by the bias magnet 40, to the free layer. In contrast to this, a magnetic collecting core may be placed in the magnetic shield to set the direction of the gap magnetic field applied to the magnetoresistive effect element. However, in this approach, since the bias magnetic field passes the magnetic collecting core, the zero point of the magnetization direction of the free layer cannot be set. Therefore, the current sensor 100 according to the embodiment fundamentally differs in structure from a current sensor having a magnetic collecting core in a magnetic shield.

(Modifications)

While the present disclosure has been described with reference to embodiments thereof, it is to be understood that the disclosure is not limited to the embodiments. The present disclosure is intended to cover various modifications and equivalent arrangements within the spirit and scope of the present disclosure.

According to the embodiment, the cross-sectional shape of the magnetic shield 30 taken along the x-z plane passing the formation surface 10a (the magnetoresistive effect element 20) is symmetrical with respect to the reference line BL. Therefore, it is not always necessary that the cross-sectional shape of the magnetic shield 30 taken along the x-z plane which does not pass the formation surface 10a (the magnetoresistive effect element 20) is symmetrical with respect to the reference line BL. That is, it is not always necessary that the entire magnetic shield 30 is symmetrical with respect to the reference line BL. Further, it is not always necessary that an outline of an outer wall of the magnetic shield 30 taken along the x-z plane passing the formation surface 10a (the magnetoresistive effect element 20) is symmetrical with respect to the reference line BL. Even in this case, the gap magnetic field in a region (a region surrounded by the inner wall of the magnetic shield 30 divided by the x-z plane passing the formation surface 10a) surrounded by the symmetrical portion becomes symmetrical with respect to the reference line BL, and the direction of the gap magnetic field at the reference line BL becomes orthogonal to the reference line BL. Thus, the gap magnetic field is applied perpendicularly to the magnetoresistive effect element 20.

According to the embodiment, each of the gaps 31 is located at the same height as the sensor substrate 10. Alternatively, some of the gaps 31 can be located at the same height as the sensor substrate 10.

According to the embodiment, the center of the gap 31 is located at the same height as the formation surface 10a. Alternatively, the center of the gap 31 can be located at a different height from the formation surface 10a.

According to the embodiment, the sensor substrate 10 is located in the center of the symmetrical portion of the magnetic shield 30. However, it is not always necessary that the sensor substrate 10 is located in the center.

According to the embodiment, two gaps 31 face each other across the sensor substrate 10. However, it is not always necessary that two gaps 31 face each other across the sensor substrate 10.

According to the embodiment, the magnetoresistive effect element 20 is formed in the sensor substrate 10. However, a magnetoelectric converter formed in the sensor substrate 10 is not limited to the embodiment. For example, a Hall device, a voltage of which changes with the magnetic field applied along the formation surface 10a, can be used.

According to the embodiment, the interlayer has insulation properties, and the magnetoresistive effect element 20 is a tunnel magnetoresistive effect element. Alternatively, the interlayer can have electrical conductivity, and the magnetoresistive effect element 20 can be a giant magnetoresistance effect device (GMR).

According to the embodiment, the full-bridge circuit is constructed with the magnetoresistive effect element 20. Alternatively, the half-bridge circuit can be constructed with the magnetoresistive effect element 20.

According to the embodiment, the bias magnet 40 is a permanent magnet. Alternatively, the bias magnet 40 can be a solenoid.

According to the embodiment, the circuit substrate 50 and the sensor substrate 10 are electrically connected through the wire 11, and the circuit substrate 50 and the sensor substrate 10 are mounted on the supporting substrate 60 and arranged next to each other. Alternatively, a stack structure, in which the sensor substrate 10 is mounted on and electrically, mechanically connected to the circuit substrate 50, can be employed.

According to the embodiment, the magnetic shield 30 has two gaps 31. Alternatively, the magnetic shield 30 can have one or more than two gaps 31.

What is claimed is:

1. A coreless current sensor for measuring a current flowing through a conductor, the current sensor comprising:
   a supporting substrate;
   a sensor substrate that is mounted on a surface of the supporting substrate, which is opposed to the conductor;
   a magnetoelectric converter formed on a surface of the sensor substrate, which is opposite from a back surface of the sensor substrate that is mounted on the supporting substrate, the magnetoelectric converter being configured to output a signal that changes with an applied magnetic field, and
   a magnetic shield that surrounds the sensor substrate and the conductor to magnetically shield the inside from the outside, wherein
   the current is measured based on a change in the output signal caused by a magnetic field induced by the current,
   the output signal of the magnetoelectric converter changes with a magnetic field applied along a formation surface of the sensor substrate, which forms the magnetoelectric converter,
   the magnetic shield has two gaps for reducing magnetic saturation in the magnetic shield,
   the two gaps and the sensor substrate are located at the same height in a z-direction orthogonal to the formation surface of the sensor substrate,
   the sensor substrate is located in the center of the symmetrical portion of the magnetic shield, and
   the two gaps face each other across the sensor substrate along a reference line that extends along the formation surface of the sensor substrate, which is opposed to the conductor, through the two gaps.

2. The current sensor according to claim 1, wherein
   the formation surface is parallel to a x-y plane defined by a x-direction and a y-direction that are orthogonal to each other,
   an outline of an inner wall of the magnetic shield divided by a x-z plane defined by the x-direction and the z-direction passing the formation surface is symmetrical with respect to the reference line which extends along the x-direction and passes the formation surface, and
   the two gaps are formed in a symmetrical portion of the magnetic shield.

3. The current sensor according to claim 1, further comprising:
   a bias magnet located inside the magnetic shield, wherein
   the magnetoelectric converter is a magnetoresistive effect element having a resistance changing with the applied magnetic field along the formation surface,
   the magnetoresistive effect element includes a pin layer, a free layer, and an interlayer,
   a magnetization direction of the pin layer is fixed,
   a magnetization direction of the free layer changes with the applied magnetic field along the formation surface, the interlayer is non-magnetic and located between the free layer and the pin layer, and the bias magnet applies a bias magnetic field to the free layer.

4. The current sensor according to claim 1, wherein the center of each of the two gaps is located at the same height as the sensor substrate in the z-direction.

5. The current sensor according to claim 1, further comprising:
a circuit substrate located inside the magnetic shield and having a circuit for processing the output signal of the magnetoelectric converter.

6. The current sensor according to claim 5, wherein the sensor substrate and the circuit substrate are fixed to the supporting substrate.

7. The current sensor according to claim 6, further comprising:
a molding resin covering the sensor substrate,
the circuit substrate, and
the supporting substrate.

8. The current sensor according to claim 7, further comprising:
a spacer made from a non-magnetic material, wherein the conductor and the molding resin covering the sensor substrate, the circuit substrate, and the supporting substrate are fixed inside the magnetic shield through the spacer.

\* \* \* \* \*